(12) United States Patent
Landgraf et al.

(10) Patent No.: US 7,811,429 B2
(45) Date of Patent: Oct. 12, 2010

(54) TARGET SUPPORT ASSEMBLY

(75) Inventors: Ralf Landgraf, Zenting (DE); Wilhelm Herwig, Beverungen (DE)

(73) Assignee: Interpane Entwicklungs - und Beratungsgesellschaft mbH & Co., KG, Lauenforde (DE)

( * ) Notice: Subject to any disclaimer, the term of this patent is extended or adjusted under 35 U.S.C. 154(b) by 1071 days.

(21) Appl. No.: 10/520,755

(22) PCT Filed: Jun. 20, 2003

(86) PCT No.: PCT/EP03/06518

§ 371 (c)(1),
(2), (4) Date: Jan. 10, 2005

(87) PCT Pub. No.: WO2004/007791

PCT Pub. Date: Jan. 22, 2004

(65) Prior Publication Data

US 2005/0224342 A1  Oct. 13, 2005

(30) Foreign Application Priority Data

Jul. 10, 2002  (DE) ............................... 102 31 203

(51) Int. Cl.
*C23C 14/34*  (2006.01)
(52) U.S. Cl. ............................ 204/298.12; 204/298.02; 204/298.21

(58) Field of Classification Search ............ 204/298.12, 204/298.21, 298.02
See application file for complete search history.

(56) References Cited

U.S. PATENT DOCUMENTS

| 5,147,521 A | | 9/1992 | Belli et al. |
| 5,531,876 A | | 7/1996 | Saunders et al. |
| 5,565,071 A | | 10/1996 | Demaray et al. |
| 5,591,314 A | * | 1/1997 | Morgan et al. ......... 204/298.22 |
| 6,409,897 B1 | | 6/2002 | Wingo |

FOREIGN PATENT DOCUMENTS

| DE | 44 14 470 A1 | 11/1995 |
| EP | 0 070 899 B1 | 7/1987 |
| EP | 0 336 613 A2 | 10/1989 |
| EP | 1 225 249 A1 | 7/2002 |
| JP | 01193463 A * | 8/1989 |
| WO | WO 97/15697 | 5/1997 |
| WO | WO 02/20866 A1 | 3/2002 |

* cited by examiner

*Primary Examiner*—Nam X Nguyen
*Assistant Examiner*—Jason M Berman
(74) *Attorney, Agent, or Firm*—Scully, Scott, Murphy & Presser, P.C.

(57) ABSTRACT

The invention relates to a target support assembly (1) comprising a support (2), on which a target lining is arranged. In order to simplify the production of the target lining or of the target support assembly and/or the placement of the target lining on the support, the target lining is formed by a target sleeve (4) that is slid onto the support (2). At least one clamping element (5) is placed, while actively clamping, between the support (2) and the target sleeve (4).

11 Claims, 3 Drawing Sheets

TARGET SUPPORT ASSEMBLY

The invention relates to a target support assembly according to the preamble of claim 1.

To apply a coating to a substantially planar substrate it is known to sputter the lining material by means of cathodic sputtering and to deposit same on the substrate. In this case a target sleeve located on a support tube forms with the latter a target support assembly. Such an apparatus for cathodic sputtering is described, for example, in EP 0 070 899 B1. To apply the coating material to a support tube it is usual to apply the lining material in a circulatory manner to the support tube by flame spraying, whereby the target the lining is formed as an indissoluble unity with the support tube. These known measures are complex and costly with regard both to forming the target lining itself and to applying the target lining to the support tube.

It is the object of the invention, in the case of a target support assembly according to the preamble of claim 1, to simplify the manufacture of the target lining or of the target support assembly, and/or the application of the target lining to the support.

This object is achieved by the features of claim 1.

In the target support assembly according to the invention the target lining is formed by a target sleeve that is slid on to the support and fixed in a thermally and electrically conductive manner. At least one preferably elastically active clamping element is arranged between the support and the target sleeve. Contrary to the prior art, the target sleeve according to the invention can be prefabricated and optionally stored, so that it can be simply and quickly installed on the carrier by sliding on, and optionally removed therefrom. Installation can take place in an associated apparatus for sputtering the lining material, for which purpose the carrier needs to be dismantled only partially, i.e. only to the extent that the target sleeve can be slid on from one end. The invention thereby makes possible several advantages relating both to the target sleeve itself and to the target support assembly.

Advantageous refinements of the invention are described in the dependent claims.

The at least one elastically active clamping element is used to fix the target sleeve in its axial direction and/or its circumferential direction on the support. In addition, the elastic clamping element may form a heat conductor and/or an electrical conductor if it is made of heat conducting and/or electrically conducting material. It is advantageous to provide a plurality of elastically active clamping elements which are preferably distributed around the circumference, whereby the fixing forces and/or the heat conduction can be increased and/or the electrical contacting can be improved.

It is advantageous to arrange the at least one clamping element in a recess in the internal cylindrical surface of the target sleeve or preferably in the external cylindrical surface of the support, in such a way that a clamping arm of the clamping element projects beyond the internal or external cylindrical surface, is self-actuatingly bent inwards when installing the target sleeve and bears with a radial stress against the opposed external or internal cylindrical surface. It is especially advantageous to fix the base of the clamping element in the recess so that it is retained in a captive manner. The clamping element may be formed, for example, by an angle-piece one arm of which forms the base of the clamping element and the other arm presses elastically against the other part. Simple and low-cost manufacture is possible, in particular, if one or more annular grooves, or axially or helically disposed grooves, are provided in which a plurality of elastically active clamping elements can be inserted.

For the purpose of achieving good dissipation of the heat generated during functional operation of the target sleeve it is advantageous to form the at least one clamping element from an elastically deformable material which, in the clamping state, presses radially against the target sleeve while being soft enough to bear in a planar manner on the target sleeve and on the opposed part, whereby efficient heat dissipation can take place because of the large abutment area. This applies to the abutment of the clamping element both on the target sleeve and on the support. Materials which, despite their elastic deformability or elastic compressibility, are electrically and thermally conductive are advantageous. A synthetic material, e.g. silicon, in which electrically or thermally conductive particles or elements, e.g. fibres, for example, of metal or carbon, are embedded is suitable for this purpose.

It is especially advantageous to provide a clamping element in annular form which is seated in an annular groove in the component carrying the clamping element and which projects so far beyond this component that it is located with a radial clamping stress between the target sleeve and the support. In addition, a circular cross-section of the clamping element is advantageous because the rounded portions facing in both axial directions form insertion faces which effect automatic yielding and elastic compression of the clamping element when the target sleeve is slid on. A further advantage of the annular form is that such a clamping element is held in a captive manner because of its annular form and therefore requires no further retaining means.

The target sleeve according to the invention does not need to be closed in the circumferential direction, although the circumferentially closed form is advantageous, in particular for reasons of strength and retention. The target sleeve may therefore have a longitudinal slot, or it may be a sleeve section which is not closed in the circumferential direction.

The target support assembly may be a tubular cathode in an apparatus for cathodic sputtering of the material of the target sleeve, and may be arranged in a low-pressure chamber of the apparatus adjacent to or above a carrier for a substrate on which the sputtered material is deposited. The target support assembly is preferably suitable for depositing a sputtering layer of material on a glass plate forming the substrate.

Advantageous configurations of the invention are elucidated in detail below with reference to a preferred embodiment and to the drawings, in which.

Figure 1:
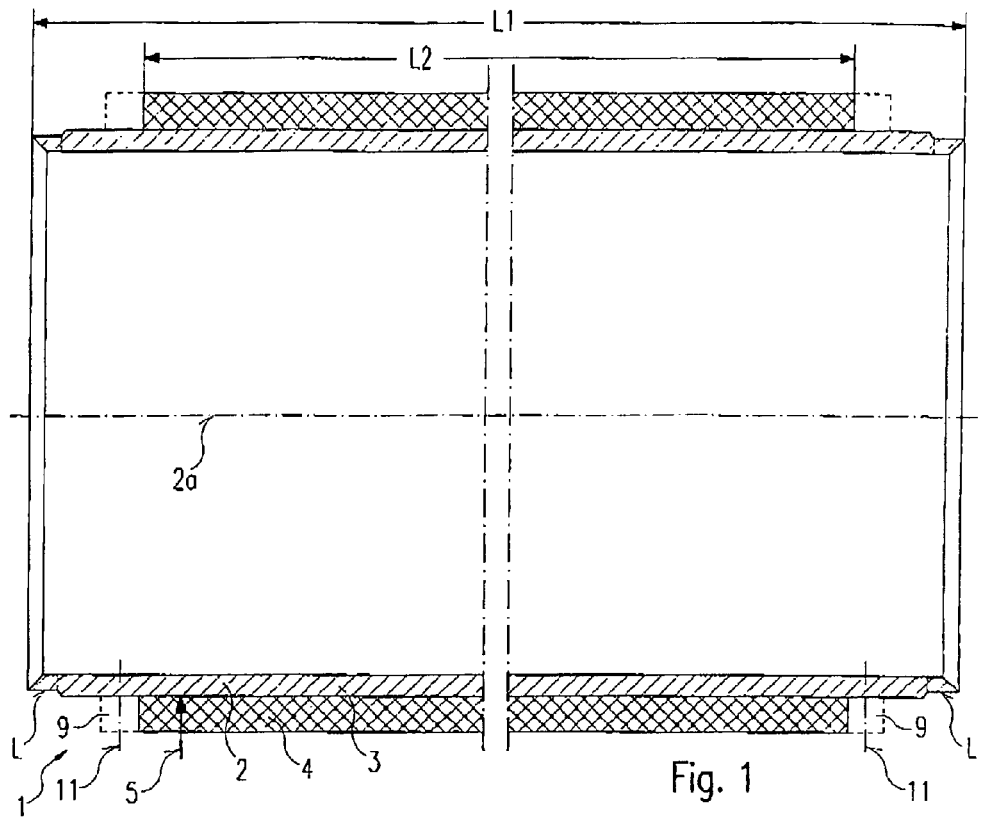
FIG. 1 shows an embodiment of a target support assembly according to the invention in axial section.
Figure 2:
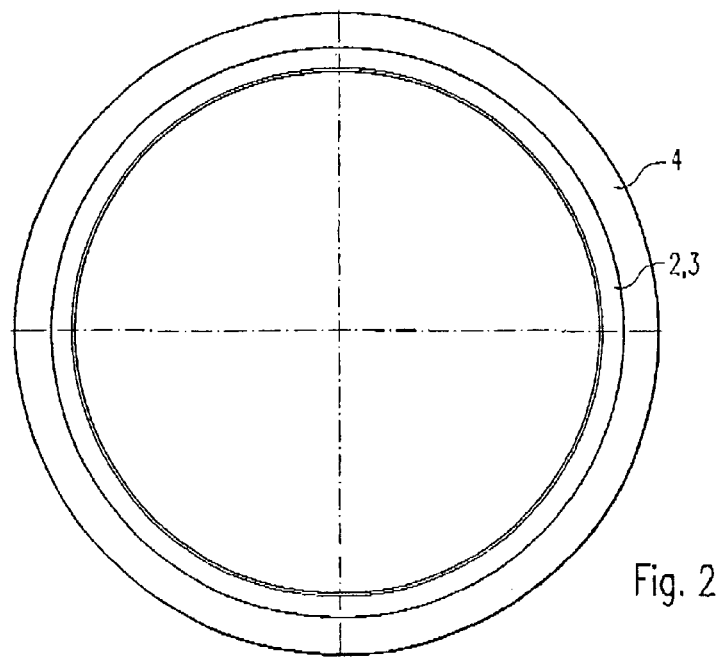
FIG. 2 shows the target support assembly in a side view.
Figure 3:
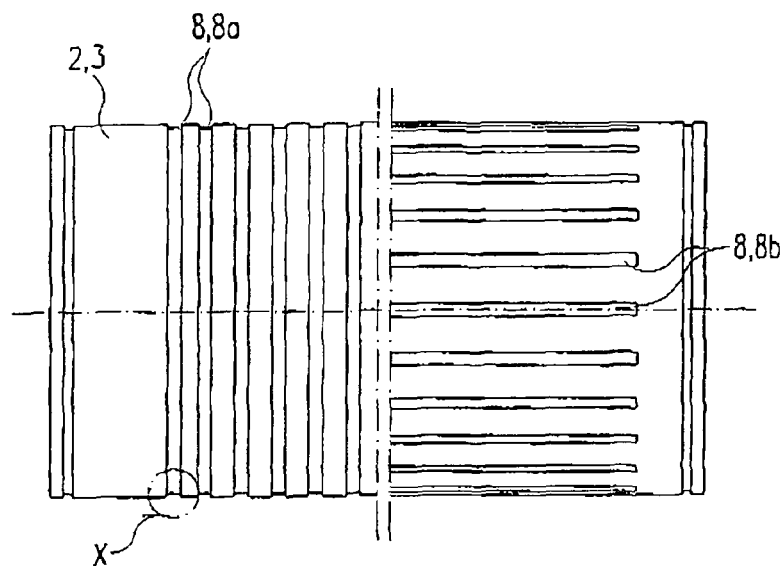
FIG. 3 shows two differently configured portions of a support of the target support assembly in a top view.

The principal components of the target support assembly designated as a whole by 1 are a support 2 which may be formed, for example, by a substantially cylindrical support sleeve 3, and a target sleeve 4 which can be slid with slight free play on to the support 2 and is fixed thereon in its circumferential and/or its axial direction by means of at least one fixing element.

The support 2 is made of metal, preferably steel. It has at its ends, at reference L, fixing means (shown only indicatively) by which it is mounted rotatably about its centre axis 2a in a bearing which forms part of an apparatus for sputtering and coating on a planar substrate, e.g. float glass (not shown). The target sleeve 3 also consists of metal.

The axial length L1 of the support 2 is greater than the axial length L2 of the target sleeve 4, the latter being arranged in the centre portion of the support 2, so that the support 2 projects beyond the support 2 at both ends.

The at least one fixing element 5, indicated by a radial arrow, is an elastically active clamping element 6 which in the present embodiment consists of resilient material and exerts a radially effective clamping stress between the support 2 and the target sleeve 4. Said fixing element 5 may be arranged on the target sleeve 4 or preferably on the support 2, as shown in the present embodiment.

Figure 4:
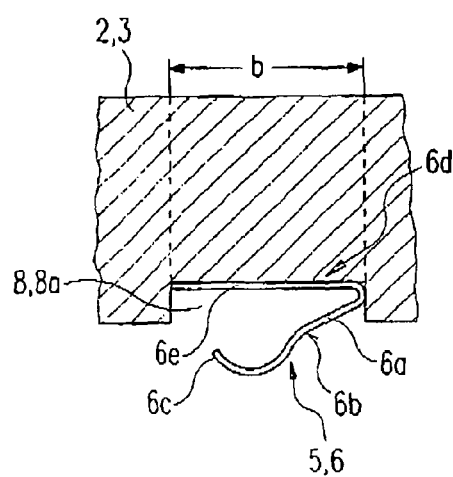
FIG. 4 shows an elastically active clamping element in its readiness position as a detail marked X in FIG. 3.
Figure 5:
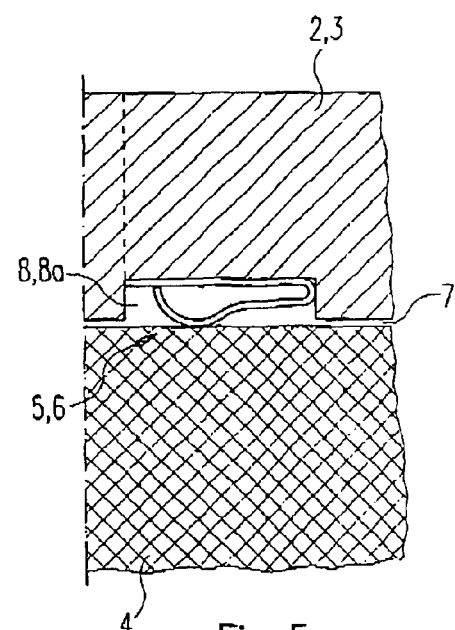
FIG. 5 shows the elastically active clamping element in its working position in which a target sleeve has been slid axially on to the support.

As can be seen especially in FIGS. 4 and 5, the clamping element 6 comprises a clamping arm 6a which in its relaxed release position, illustrated in FIG. 4, projects beyond the associated cylindrical surface or hollow cylindrical joint 7 between the support 2 and the target sleeve 4. When the support sleeve 4 is installed by being slid on to the support 2, the clamping arm 6a extending obliquely with respect to the joint 7 and forming an oblique or rounded insertion edge 6b, is self-actuatingly bent inwards, the elastic bending stress generated thereby providing the radially active elastic stress between the support 2 and the target sleeve 4 which ensures the fixing. It is advantageous to provide the free end of the clamping arm 6a with an insertion segment 6c extending oppositely and having an oblique or rounded configuration, so that the above-described self-actuating bending-in of the clamping arm 6a takes place automatically when the target sleeve 4 is slid on optionally from one side or the other.

The base end of the clamping arm 6a is preferably joined integrally to a clamping element base 6d which is arranged in a recess 8 and fixed therein, for example, by a screw (not shown). The clamping element base 6d is preferably formed by a base arm 6e connected to the clamping arm 6a, which base arm 6e may be fixed in the recess 8 in that its length is slightly greater than the width b of the recess 8, so that the base arm 6e is firmly wedged between the side walls of the recess 8 by press-fitting.

The insertion segment 6c may be sufficiently long for its free end to bear in the clamping position against the part carrying the clamping element 6, here the support 2 or the base of the recess 8 or the base arm 6d, as shown in FIG. 5. The clamping force of the clamping element 6 can thereby be increased. The clamping element 6 is preferably formed by an angled spring, in particular a leaf spring.

The clamping element 6 may perform not only the function of fixing but also of conducting heat from the target sleeve 4 to the support 2 and/or of conducting current between the support 2 and the target sleeve 4, if said clamping element 6 is made of thermally and/or electrically conductive material.

In order to increase the fixing forces and/or the heat dissipation and/or the electrical conduction, it is advantageous to provide a plurality of clamping elements 6 which are preferably distributed over the full circumference, so that a function distributed substantially over the full circumference is produced.

One or more recesses 8 may be formed in each case by one or more annular grooves 8a extending in the circumferential direction, or one or more longitudinal grooves 8b extending in the axial direction 2a, in which case a plurality of such grooves 8a, 8b may be distributed approximately uniformly, axially or circumferentially, in the area of the target sleeve 4.

It is also possible to provide one or more helical grooves (not shown) distributed on the circumference.

As shown in FIG. 1, for optionally additional axial fixing, preferably annular limiting parts 9 may be located on the support 2 at the ends of the target sleeve 4 and connected detachably to said support 2, for example, by means of (indicatively illustrated) screws 11, which effect an axial fixing of the target sleeve 4 on the support 2.

Figure 6:
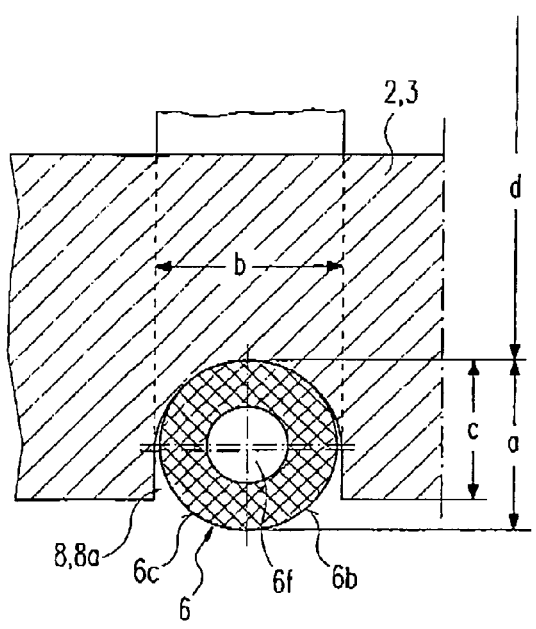
FIG. 6 shows an elastically active clamping element in its readiness position as a detail marked X in FIG. 3 in a modified configuration.
Figure 7:
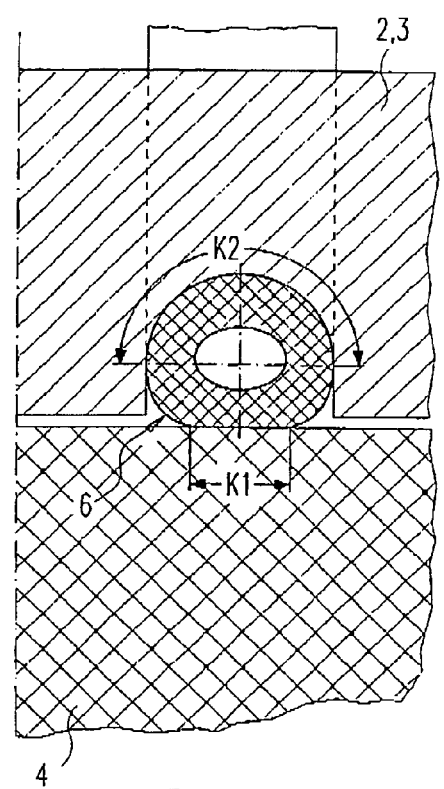
FIG. 7 shows the elastically active clamping element according to FIG. 6 in its clamping position in which a target sleeve has been slid axially on to the carrier.

The embodiment according to FIGS. 6 and 7, in which the same or comparable parts are denoted by the same reference symbols, includes a clamping element or clamping element arrangement in a modified configuration which is advantageous for several reasons.

A first difference to the above-described embodiment is that this clamping element 6 is made of material which is so elastically deformable and/or elastically compressible that, because of its radial clamping stress, it bears in a planar manner both on the target sleeve and on the support, thereby forming in each case a large contact area through which the electrical conduction and heat dissipation take place.

The thermal and electrical conductivity of the elastically deformable or elastically compressible material of the clamping element 6 may be effected by embedding therein particles or fibres of electrically and thermally conductive material, in particular of metal or carbon, while the elastic base material may consist of synthetic material, in particular silicon.

In the present embodiment the clamping element 6 has the form of an open or closed ring and is located in an annular recess 8, e.g. an annular groove. The radial dimension a of the clamping element 6 in the radially relaxed state is greater than the radial dimension c of the recess 8, so that the clamping element projects beyond the recess 8 and is compressed to the shape according to FIG. 7, in which it is radially deformed and optionally also compressed under the radial stress produced when the target sleeve 4 is slid on. The axial dimension of the contact face K1, with which the clamping element 6 bears against the target sleeve 4, is of considerable size, especially if the clamping element has an annular configuration in the manner described above, since in this case the contact area K1 extends over a major portion or the whole of the circumference.

Because of the radial clamping stress, the clamping element also bears in a planar manner on the base surface of the recess 8. This surface can be further enlarged if it is rounded in axial cross-section. In the present embodiment the base of the recess is concavely rounded and the clamping element 6 is correspondingly convexly rounded. In this case it is advantageous for the clamping element 6 to be configured sufficiently wide for it also to bear against the side walls of the recess 8 when under radial clamping stress, whereby the contact area K2 is further enlarged, as is desired. In the present embodiment the clamping element 6 is formed by a ring which is circular in cross-section, the internal diameter d of which corresponds to the internal diameter of the base of the annular groove or is somewhat smaller, so that the clamping ring thus formed bears against the base of the annular groove with an elastic loading. Because of its annular shape the clamping element 6 is also retained in a captive manner.

In the present embodiment the clamping element 6 is a hollow body having a central cavity 6f. If the clamping element 6 is a clamping ring, it may be formed by an endless hose, in particular a thick-walled hose, the wall thickness of which may be approximately one-quarter of its cross-sectional dimension.

The at least externally rounded form of the clamping element 6 is advantageous because it forms insertion faces 6b, 6c on both sides, which make possible self-actuating displacement of the clamping element 6 into the recess 8 when the target sleeve is pushed on or the support 2 is pushed in.

The elasticity of the clamping element 6, in its closed annular configuration, is so great that for installation or removal it can be stretched over the external diameter of the support 2 and, once in the annular groove 8a, contracts self-actuatingly to the base of same, preferably so far that it bears with a contraction stress against the base of the groove.

The invention claimed is:

1. Target support assembly (I), comprising a cylindrical support sleeve (2) on which is arranged a target lining formed by a cylindrical target sleeve (4) that is slidingly arranged on the support sleeve (2), wherein a plurality of elastically-active clamping elements (6) being distributed between the facing circumferences of said sleeves are each arranged in a respective recess (8) of a plurality of recesses formed in the external cylindrical surface of the support sleeve (2), each said clamping element (6) having a portion (6a) press-fitted in the therewith associated recess (8) and possessing a radially projecting portion (6a, b, c) in clamping contact with the internal cylindrical surface of the target sleeve (4) that is located opposite said clamping elements (6); the clamping elements (6) each comprising an elastically deformable and/or elastically compressible electrically and thermally conductive material; each of said clamping elements (6) being constituted of an angled leaf spring having the portion (6c) forming a base arm (6d) extending along the bottom of the therewith associated recess (8) and wherein the base arm (6e) has opposite ends wedged between the side walls of the recess (8) and a clamping arm (6a) of said clamping element extending radially angled outwardly from said recess (8), said clamping arm (6a) having a free end forming an outwardly curvilinear portion (6b, c) for clampingly contacting the oppositely located surface of the target sleeve (4); and wherein the clamping elements (6) have selectively rounded or oblique insertion edges (6b, 6c) on both sides facing in an axial direction.

2. Target support assembly (I), comprising a cylindrical support sleeve (2) on which is arranged a target lining formed by a cylindrical target sleeve (4) that is slidingly arranged on the support sleeve (2), wherein a plurality of elastically active clamping elements (6) distributed between the facing circumferences of said sleeves are each arranged in a respective recess (8) of a plurality of recesses formed in the internal cylindrical surface of the target sleeve (4), each said clamping element (6) having a portion (6a) press-fitted in the therewith associated recess (8) and possessing a radially projecting portion (6a, b, c) in clamping contact with the external cylindrical surface of the support sleeve (2) that is located opposite said clamping elements (6); the clamping elements (6) each comprising an elastically deformable and/or elastically compressible electrically and thermally conductive material; each of said clamping elements (6) being constituted of an angled leaf spring having the portion (6c) forming a base arm (6d) extending along the bottom of the therewith associated recess (8), and wherein the base arm (6e) has opposite ends wedged between the side walls of the recess (8) and a clamping arm (6a) of said clamping element extending radially angled outwardly from said recess (8), said clamping arm (6a) having a free end forming an outwardly curvilinear portion (6b, c) for clampingly contacting the oppositely located surface of the support sleeve (2); and wherein the clamping elements (6) have selectively rounded or oblique insertion edges (6b, 6c) on both sides facing in an axial direction.

3. Target support assembly according to claim 1 or 2, wherein the clamping elements (6) have in each case a clamping arm (6a) that exerts the clamping pressure exerted with the free end portion of the clamping arm (6a).

4. Target support assembly according to claim 1 or 2, wherein an insertion segment (6c) is arranged at the free end of the clamping arm (6a) and forms an angled or rounded roof-shaped element with the clamping arm (6a).

5. Target support assembly according to claim 4, wherein the free end of the insertion segment (6c) is supported in opposition to the clamping pressure in the clamping position thereof.

6. Target support assembly (I), comprising a cylindrical support sleeve (2) on which is arranged a target lining formed by a cylindrical target sleeve (4) that is slidingly arranged on the support sleeve (2), wherein a plurality of elastically active clamping elements (6) distributed between the facing circumferences of said sleeves are each arranged in a respective recess (8) of a plurality of recesses formed in the external cylindrical surface of the support sleeve (2), each said clamping element (6) having a portion (6a) located in the therewith associated recess (8) and a radially projecting portion (6b, c) in clamping contact with the internal cylindrical surface of the target-sleeve (4) located opposite said clamping elements (6); the clamping elements (6) each comprising an elastically deformable and/or elastically compressible electrically and thermally conductive material; each of said clamping elements (6) being constituted of a ring-shaped tubular member of hollow cross-section having portion (6a) extending along a curved bottom of the therewith associated recess (8) and between the side walls of the recess (8), the curved bottom of said recess (8) being a concavely rounded base and the cross-section of the clamping element (6) being correspondingly convexly rounded, and with portion (6b, c) forming a resilient clamping surface extending radially outwardly of said recess (8), said clamping surface (6b, c) having a deformable curvilinear shape for clampingly contacting the oppositely located surface of the target sleeve.

7. Target support assembly (I), comprising a cylindrical support sleeve (2) on which is arranged a target lining formed by a cylindrical target sleeve (4) that is slidingly arranged on the support sleeve (2), wherein a plurality of elastically active clamping elements (6) distributed between the facing circumferences of said sleeves are each arranged in a respective recess (8) of a plurality of recesses formed in the internal cylindrical surface of the target sleeve (4), each said clamping element (6) having a portion (6a) located in the therewith associated recess (8) and a radially projecting portion (6a, b, c) in clamping contact with the external cylindrical surface of the support sleeve (2) located opposite said clamping elements (6); the clamping elements (6) each comprising an elastically deformable and/or elastically compressible electrically and thermally conductive material; each of said clamping elements (6) being constituted of a ring-shaped tubular member of hollow cross-section having portion (6a) extending along a curved bottom of the therewith associated recess (8) and between the side walls of the recess (8), the curved bottom of said recess (8) being a concavely rounded base and the cross-section of the clamping element (6) being correspondingly convexly rounded, and with portion (6b, c) forming a resilient clamping surface extending radially outwardly of said recess (8), said clamping surface (6b, c) having a deformable curvilinear shape for clampingly contacting the oppositely located surface of the support sleeve.

8. Target support assembly according to claim 6 or 7, wherein the clamping elements (6) have, at least in the area of an opening of the therewith associated recess (8), a shape that is convexly rounded, viewed transversely to the axial direction of the support sleeve.

9. Target support assembly according to claim 6 or 7, wherein the clamping elements (6) and the recess (8) have an annular configuration.

10. Target support assembly according to any one of claims 1, 2, 6 or 7, wherein at least one of said recesses (8) is formed as a groove (8a, 8b) selectively extending in the annularly circumferential, or axial direction, or helically on said cylindrical sleeves.

11. Target support assembly according to any one of claims 1, 2, 6 or 7, wherein the length (L1) of the support sleeve (2) is greater than the length (L2) of the target sleeve (4) and at least one annular limiting part (9) is fixed detachably on the support sleeve (2) at selectively one or both ends of the target sleeve (4).

* * * * *